US007781779B2

(12) United States Patent
Nemchuk

(10) Patent No.: US 7,781,779 B2
(45) Date of Patent: Aug. 24, 2010

(54) LIGHT EMITTING DEVICES INCLUDING WAVELENGTH CONVERTING MATERIAL

(75) Inventor: Nikolay I. Nemchuk, North Andover, MA (US)

(73) Assignee: Luminus Devices, Inc., Billerica, MA (US)

(*) Notice: Subject to any disclaimer, the term of this patent is extended or adjusted under 35 U.S.C. 154(b) by 0 days.

(21) Appl. No.: 12/115,497

(22) Filed: May 5, 2008

(65) Prior Publication Data
US 2009/0040745 A1 Feb. 12, 2009

Related U.S. Application Data

(60) Provisional application No. 60/928,280, filed on May 8, 2007.

(51) Int. Cl.
| H01L 27/15 | (2006.01) |
| H01L 29/26 | (2006.01) |
| H01L 31/12 | (2006.01) |
| H01L 33/00 | (2006.01) |
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |
| H01L 29/205 | (2006.01) |
| H01L 29/22 | (2006.01) |
| H01L 29/227 | (2006.01) |
| H01L 29/24 | (2006.01) |

(52) U.S. Cl. .............. 257/79; 257/13; 257/91; 257/94; 257/95; 257/98; 257/102; 257/103; 257/E31.001; 257/E33.067

(58) Field of Classification Search .............. 257/13, 257/79, 91, 94–95, 98, E33.001, E33.067, 257/102–103
See application file for complete search history.

(56) References Cited

U.S. PATENT DOCUMENTS

| 5,959,316 | A | 9/1999 | Lowery |
| 5,998,925 | A | 12/1999 | Shimizu et al. |
| 6,252,254 | B1 | 6/2001 | Soules et al. |
| 6,277,301 | B1 | 8/2001 | Höhn et al. |
| 6,351,069 | B1 | 2/2002 | Lowery et al. |
| 6,366,018 | B1 | 4/2002 | Garbuzov et al. |
| 6,404,125 | B1 | 6/2002 | Garbuzov et al. |
| 6,417,019 | B1 | 7/2002 | Mueller et al. |
| 6,544,438 | B2 | 4/2003 | Yocom et al. |
| 6,580,097 | B1 | 6/2003 | Soules et al. |
| 6,600,175 | B1 | 7/2003 | Baretz et al. |
| 6,603,258 | B1 | 8/2003 | Mueller-Mach et al. |
| 6,642,652 | B2 | 11/2003 | Collins, III et al. |
| 6,682,207 | B2 | 1/2004 | Weber et al. |
| 6,686,691 | B1 | 2/2004 | Mueller et al. |
| 6,783,700 | B2 | 8/2004 | Tian et al. |

(Continued)

FOREIGN PATENT DOCUMENTS

EP 558801 A1 * 9/1993

(Continued)

*Primary Examiner*—Ida M Soward
(74) *Attorney, Agent, or Firm*—Wolf, Greenfield & Sacks, P.C.

(57) ABSTRACT

Light-emitting devices and associated methods are provided. The light emitting devices can have a wavelength converting material-coated emission surface.

33 Claims, 3 Drawing Sheets

U.S. PATENT DOCUMENTS

| | | |
|---|---|---|
| 6,809,347 B2 | 10/2004 | Tasch et al. |
| 6,812,500 B2 | 11/2004 | Reeh et al. |
| 6,831,302 B2 | 12/2004 | Erchak et al. |
| 6,850,002 B2 | 2/2005 | Danielson et al. |
| 6,943,380 B2 | 9/2005 | Ota et al. |
| 7,078,732 B1 | 7/2006 | Reeh et al. |
| 7,084,434 B2 | 8/2006 | Erchak et al. |
| 7,138,660 B2 | 11/2006 | Ota et al. |
| 7,157,746 B2 | 1/2007 | Ota et al. |
| 7,170,100 B2 * | 1/2007 | Erchak et al. .................. 257/88 |
| 7,183,577 B2 | 2/2007 | Mueller-Mach et al. |
| 7,187,011 B2 | 3/2007 | Tasch et al. |
| 7,196,354 B1 | 3/2007 | Erchak et al. |
| 7,227,190 B2 | 6/2007 | Yasukawa et al. |
| 7,267,787 B2 | 9/2007 | Dong et al. |
| 7,311,858 B2 | 12/2007 | Wang et al. |
| 7,361,938 B2 * | 4/2008 | Mueller et al. ................. 257/94 |
| 7,368,179 B2 | 5/2008 | Tian et al. |
| 7,427,366 B2 | 9/2008 | Tian et al. |
| 2004/0021229 A1 | 2/2004 | Kinsman |
| 2005/0093007 A1 * | 5/2005 | Steigerwald et al. ........... 257/89 |
| 2006/0015118 A1 * | 1/2006 | Richter et al. .................. 606/90 |
| 2007/0064131 A1 * | 3/2007 | Sawanobori et al. ......... 348/294 |
| 2007/0125982 A1 | 6/2007 | Tian et al. |
| 2007/0228931 A1 * | 10/2007 | Kim et al. .................... 313/501 |
| 2008/0116467 A1 * | 5/2008 | Mueller et al. ................. 257/89 |
| 2008/0128727 A1 * | 6/2008 | Erchak et al. .................. 257/98 |
| 2008/0197373 A1 * | 8/2008 | Kim ............................ 257/98 |
| 2009/0309114 A1 | 12/2009 | Lu et al. |

FOREIGN PATENT DOCUMENTS

JP        02208990 A  *  8/1990

* cited by examiner

LIGHT EMITTING DEVICES INCLUDING WAVELENGTH CONVERTING MATERIAL

RELATED APPLICATIONS

This application claims priority under 35 U.S.C. §119(e) to U.S. Provisional Application Ser. No. 60/928,280, filed on May 8, 2007, which is herein incorporated by reference in its entirety.

FIELD OF INVENTION

The present invention relates generally to light emitting devices and, in particular, light emitting devices having a wavelength converting material-coated light emission surface.

BACKGROUND OF INVENTION

Light emitting devices (e.g., light emitting diodes or LEDs) have gained in popularity over recent years. Liquid Crystal Display (LCD) systems have increased in popularity and availability during recent years due to their light weight, high brightness and size.

Likewise, as LCD technology has developed so has LED technology such that some LCD systems are backlit by an array or multiple arrays of LEDs. Some backlit units utilize individual LEDs that produce white light. Producing white light from a single diode can be accomplished by disposing a phosphor on the LED. For example, an LED emitting light a wavelength of 470 nm (blue light) can have its initial wavelength converted to a different wavelength when coated with a yellow phosphor. The resultant wavelength conversion can result in white light emission. While white LEDs have been produced, it has been challenging to increase the brightness of white LEDs. Other downfalls to the typical approach to producing LEDs that emit white light can be achieving a desired color point and/or color temperature and reducing the costs of defective diodes.

Therefore, methods and devices that can achieve these desired results continue to be sought.

SUMMARY OF INVENTION

Light-emitting devices, and related components, systems, and methods associated therewith are provided.

In one embodiment, a light emitting device is provided. The device comprises a multi-layer stack of material including a n-doped region, an p-doped region and a light generating region disposed between the n-doped and p-doped regions. At least a portion of the light generated from the light generating region emerges from the light emitting device via a top emission surface of the multi-layer stack of materials. The device further comprises a wavelength converting material layer disposed according to a pattern on the top emission surface of the multi-layer stack of material. Sidewalls of the multi-layer stack of material are substantially devoid of the wavelength converting material.

In another embodiment, a method of controlling color point of a wafer is provided. The method comprises providing a wafer configured for emitting light; determining a desired color point of light emitted by said wafer; determining the applied thickness and/or pattern of a wavelength converting material to achieve said desired color point; and forming a layer of wavelength converting material having the determined thickness and/or pattern on a top surface of the wafer.

In another embodiment, a method of a method of forming a light emitting device is provided. The method comprises providing a multi-layer stack of material; disposing a wavelength converting material on a top surface of the multi-layer stack of material; and, dicing the multi-layer stack of material into a plurality of mesas.

In another embodiment, a light emitting device is provided. The device comprises a multi-layer stack of material including a n-doped region, an p-doped region and a light generating region disposed between the n-doped and p-doped regions, wherein at least a portion of the light generated from the light generating region emerges from the light emitting device via a top emission surface of the multi-layer stack of materials. The device further comprises a first wavelength converting material region disposed on at least a portion of the emission surface and a second wavelength converting material region disposed on at least a portion of the top emission surface. The first wavelength converting material is configured to emit light at a different frequency than the second wavelength converting material.

In another embodiment, a light emitting device is provided. The device comprises a multi-layer stack of material including a n-doped region, an p-doped region and a light generating region disposed between the n-doped and p-doped regions. At least a portion of the light generated from the light generating region emerges from the light emitting device via a top emission surface of the multi-layer stack of materials, wherein a plurality of recesses are formed in the top emission surface. A wavelength converting material layer is disposed in the recesses in the top emission surface.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DESCRIPTION OF INVENTION

In one embodiment, the present invention features a light emitting device which can include a multi-layer stack of materials. The multi-layer stack of materials typically includes an n-doped region, a p-doped region and a light generating region disposed between the n-doped and p-doped regions. The emission surface (e.g., top layer of the multi-layer stack which, for example, may be the n-doped region or p-doped) is configured so that light generated by the light-generating region can emerge from the light-emitting device via this emission surface. In some embodiments, the top emission surface can be a textured surface that is configured to induce light extraction of the device. Some of the textured surfaces as referred herein are roughened surface textures, or holes arranged in a pattern to create a photonic lattice within one of the doped layers. Such patterns and textures have been described in U.S. Pat. Nos. 7,084,434 and 7,083,993 and 7,196,354, which are incorporated herein by reference in their entireties. The light emitting device can also include a layer of a wavelength converting material disposed according to a pattern on a top or within an emission surface of the multi-layer stack. The pattern of wavelength converting material can be used to convert the wavelength of the portion of the light emitted by the light-emitting device that passes through the pattern, while not converting the wavelength of the portion of light emitted by the light-emitting device that does not pass through the pattern. Such an affect may be desirable, for example, to control color of the emitted light which can be a combination of the different wavelengths emitted by different portions of the device.

In one aspect of the present invention, at least 50% of the light generated by the light emitting device can emerge from the emission surface. In another embodiment, at least 75% of the light generated by the light emitting device can emerge from the emission surface. In still another aspect, at least 90% of the light generated by the light emitting device can emerge from the emission surface.

Figure 1:
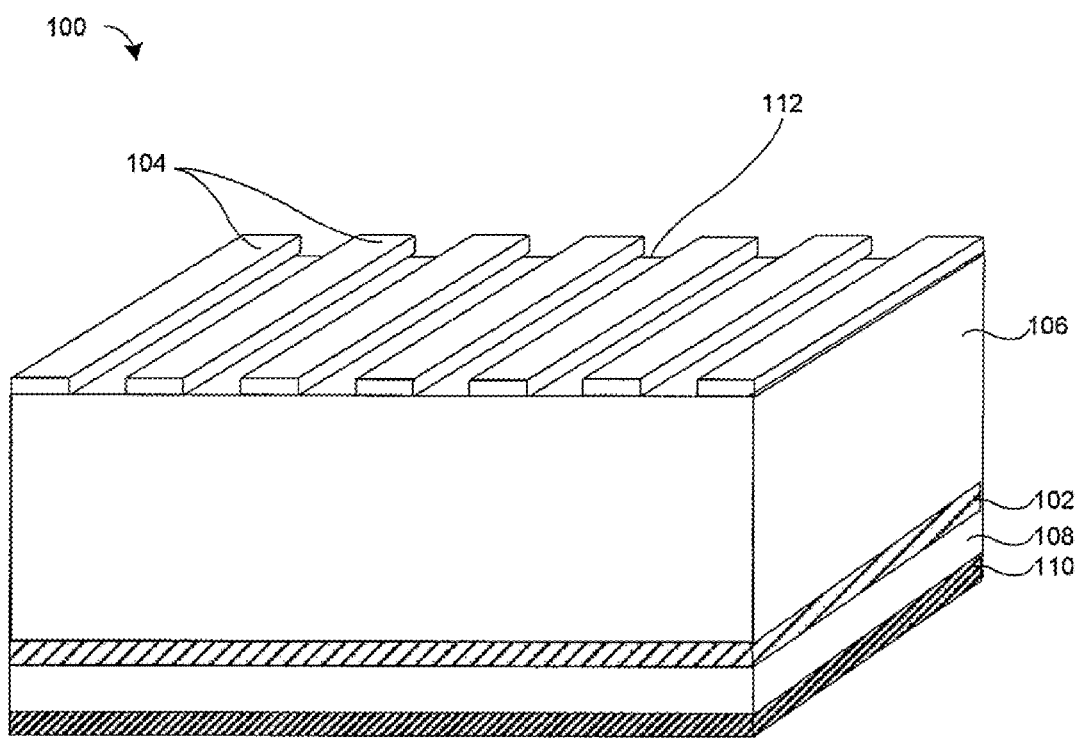
FIG. 1 illustrates a schematic drawing showing a patterned phosphor layer disposed on an emitting surface of an LED according to an embodiment of the invention.

Referring to FIG. 1, light-emitting device 100 can include, as described above, a multi-stack of material having a p-doped region 108, an n-doped region 106 and an active region 102 disposed between the two regions. Light can be generated in the light generating region and can escape the device through a top emission surface 112. The top emission surface (e.g., the n-doped layer) can be configured to have substantially all the light be emitted through the emission surface. As mentioned herein, the light-emitting device can include a patterned layer of wavelength converting material 104 (e.g., phosphor). In this embodiment, sidewalls 107 of the light emitting device may be substantially devoid of the wavelength converting material.

One skilled in the art can appreciate that the pattern layer of wavelength converting material can be formed in any suitable pattern. In some cases, the pattern is selected to achieve a desired color point and/or color temperature. In these cases, the pattern may be pre-determined. A color point may be specified as a mixture of red, green, and blue light, or other combinations of colors, as the techniques presented herein are not limited in this respect. In one embodiment, the color point can be specified by a proper ratio of red, green, and blue light.

FIG. 1 illustrates a patterned wavelength converting material layer including a series of stripes or bands of wavelength converting material. Other patterns include rings, concentric ridges, squares, rectangles, circles, amongst others. In some cases, the pattern comprises a plurality of discrete features of wavelength converting material. That is, the discrete features may be arranged in the pattern. The specific pattern will depend on the embodiment and the desired affect on emitted light.

The pattern of wavelength converting material may cover greater than 50% of the emission surface are; in some cases, greater than 75% of the emission surface area; and, in some cases greater than 90% of the emission surface area. In some cases, the coverage of the emission surface may be lower. For example, the wavelength converting material may cover less than 50% of the emission surface area. In some cases, the wavelength converting material may be between 25% and 75% of the emission surface area.

The thickness of the wavelength converting material is generally not limited and depends on the embodiment. In some cases, it may be desirable for the wavelength converting material to be sufficiently thick such that substantially all light passing through the material is converted. In some embodiments, the thickness of the wavelength converting material may be between 100 nm and 100 microns; and, in some cases, greater than 10 micron.

A cross-sectional dimension (e.g., length, or width) of the wavelength converting material also depends on the embodiment and is generally not limited. The cross-sectional dimension may be, for example, less than 1 micron, or less than 10 microns, or less than 100 microns. In other embodiments, the cross-sectional dimension may be between 1 micron and 100 microns.

Disposing a wavelength converting material on an LED has been done to achieve white light from a single point source. Typically, white light is achieved by disposing a yellow phosphor on a blue LED. However, other colors or wavelengths can be achieved. For example, the light emitting device can be configured to emit green, blue, amber, yellow, red, UV and IR color and/or wavelengths. The depositing has been done after the dicing of the LED wafer. Certain conventional LEDs emit the majority of the generated light through side walls rather than the top surface. Thus, such LEDs can have phosphor deposited on the side walls such that light passing through the side walls will have the wavelength converted by the wavelength converting material into a second wavelength. Consistency and accuracy of achieving a desired color point between multiple LEDs can be difficult. Additionally, many LEDs are discarded if they cannot emit the proper color point. The current invention proposes ways to achieve uniform color points across multiple LEDs, while increasing the economic efficiency.

Wavelength-converting material is a material that can convert the wavelength of absorbed light. The wavelength-converting materials can function by absorbing light having a first wavelength and emitting light having a second wavelength (e.g., longer wavelengths). In some preferred embodiments, the wavelength-converting material is a phosphor material. The phosphor material can be present in particulate form. The particles may be distributed in a second material (e.g., an encapsulant or adhesive, such as epoxy) to form a composite structure.

Any suitable phosphor material may be used. Suitable wavelength converting materials have been described in U.S. Pat. No. 7,196,354 which is incorporated herein by reference in its entirety. In some embodiments, the phosphor material may be a yellow phosphor material (e.g., $(Y,Gd)(Al,Ga)G:Ce^{3+}$, sometimes referred to as a "YAG" (yttrium, aluminum, garnet) phosphor), a red phosphor material (e.g., $L_2O_2S:Eu^{3+}$), a green phosphor material (e.g., $ZnS:Cu,Al,Mn$), and/or a blue phosphor material (e.g., $(Sr,Ca,Ba,Mg)_{10}(PO_4)_6Cl:Eu^{2+}$).

In some embodiments, the wavelength-converting material may include nanodots (also, referred to as "quantum dots" or "semiconductor nanocrystals"). The nanodots can be distributed in a second material (e.g., an encapsulant or adhesive, such as epoxy, or an insulator, such as glass) to form a composite structure. For example, semiconductor nanodots can be formed of group IV semiconductors (e.g., silicon, germanium), III-V semiconductors, II-VI semiconductors, and combinations thereof, as the invention is not limited so.

Nanodots can include a core region, formed of a suitable material, and one or more shell layers. Light emission wavelength(s) from the nanodots can depend on the materials that form the nanodots and/or the diameter of the nanodots. These factors can influence the energy levels of carriers (e.g., electrons, holes) within the nanodots and hence determine absorption and/or emission wavelength(s). For example, nanodots having a CdSe core and a diameter of about 1.9 nm to about 6.7 nm may emit light having wavelengths between about 465 nm to 640 nm; nanodots having a CdSe core, a ZnS shell, and a diameter of about 2.9 nm to about 6.1 nm may emit light having wavelengths between 490 nm to 620 nm; nanodots having a CdTe core, a CdS shell, and a diameter of about 3.7 nm to about 4.8 nm may emit light having wavelengths between 620 nm to 680 nm; nanodots having a PbS core and a diameter of about 2.3 nm to about 2.9 nm may emit light having wavelengths between 850 nm to 950 nm; nanodots having a PbSe core and a diameter of about 3.5 nm to about 9 nm may emit light having wavelengths between 1200 nm to 2340 nm.

Figure 2:
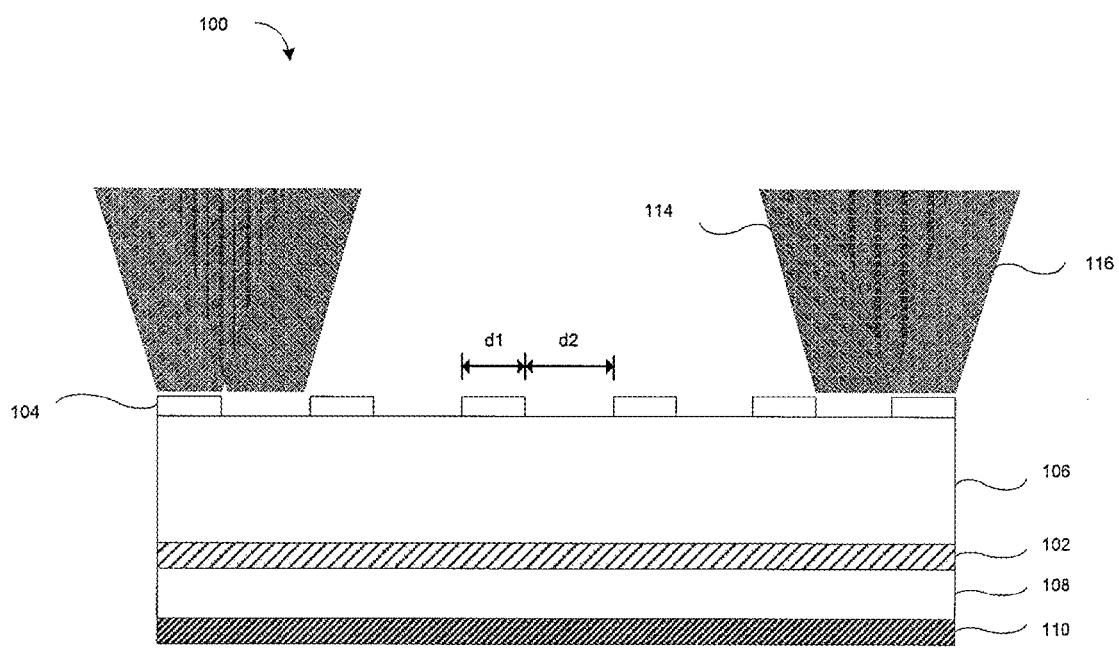
FIG. 2 illustrates a schematic drawing showing a patterned phosphor layer disposed on an emitting surface of an LED according to an embodiment of the invention.

FIG. 2 illustrates an LED 100 having wavelength converting material 104 (e.g., phosphor) disposed on at least a portion of the emission surface 112 of the light emitting device. FIG. 2 further illustrates an LED having an optimized color point and/or color temperature controlled according to the patterned utilized. For example, wavelength converting material 104 can be disposed on top of the emission surface according to a striped pattern. In an alternative embodiment, the wavelength converting material can be disposed on to the LED in an arrangement of dots.

One skilled in the art can control the color point, in part, by controlling the pattern of the wavelength converting material and the extent of coverage on the emission surface. In some cases, this can involve adjusting the ratio of the size (d1) of the wavelength converting material 104 in relation to the distance (d2) to an adjacent wavelength converting region 112. This ratio, also known by "filling factor", can be adjusted to an optimum or desired color point. As shown, the wavelength converting material does not cover the entire emission surface of the LED rather only a portion of the surface, thus allowing light having a first wavelength 114 to convert to a second wavelength 116 and afterwards emitted. Subsequently, the emitted light of both wavelengths can homogenize to form the desired color point. In some embodiments, greater than 10% of light emitted at a first wavelength can be converted to a desired second wavelength. In another embodiment, greater than 50% of light emitted at a first wavelength can be converted to a desired second wavelength. In still another embodiment, greater than 75% of light emitted at a first wavelength can be converted to a desired second wavelength. In this embodiment, sidewalls of the light emitting device may be substantially devoid of the wavelength converting material.

Figure 3:
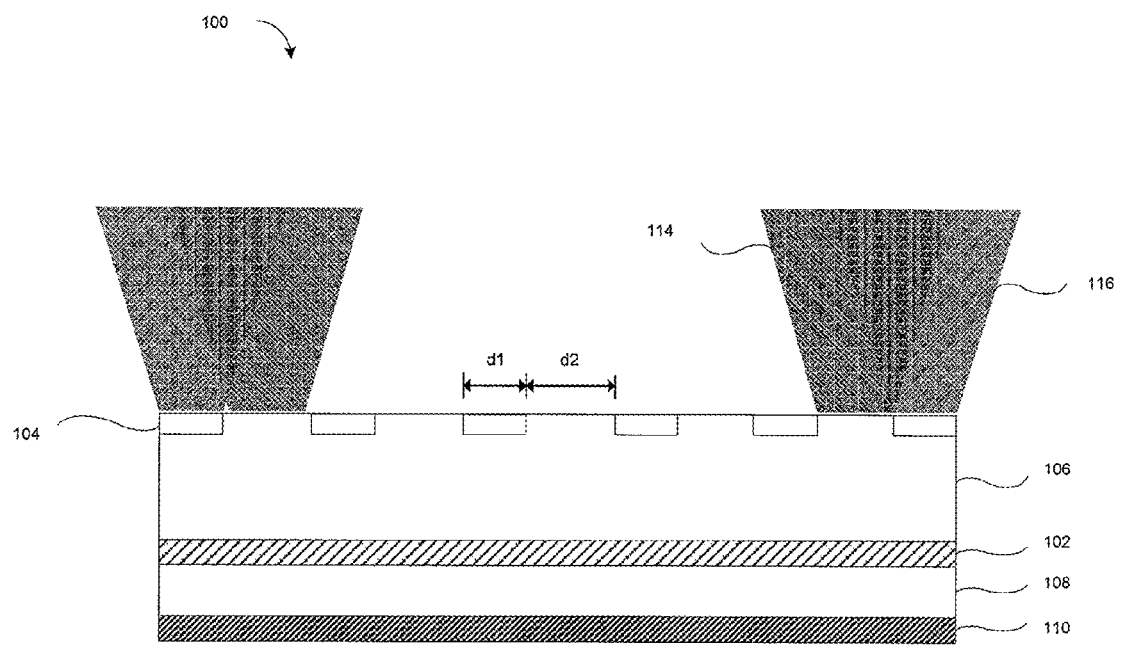
FIG. 3 illustrates a schematic drawing showing a patterned phosphor layer disposed on an emitting surface of an LED according to an embodiment of the invention.

FIG. 3 depicts a light-emitting device 100 having an n-doped region 106, a p-doped region 108, a light generating region 102 and a wavelength converting material 104 disposed within recesses within the n-doped region. In this embodiment, the wavelength material is formed only within the recesses and not on other portions of the top emission surface. The recesses can be formed according to a desired pattern. The recesses can be on the nano scale (i.e., dimensions less than 1 micron), such as holes for a photonic lattice. In another embodiment, the recesses can be macro sized and the wavelength converting material can be disposed within the recess. The recesses can be formed or etched into at least a portion of the n-doped region or in at least a portion of the light generating region or alternatively in at least a portion of the p-doped region. The recesses can also extend through all three regions respectively. Additionally, the wavelength converting material need not be flush with the top emission surface as shown in FIG. 3. In this embodiment, sidewalls of the light emitting device may be substantially devoid of the wavelength converting material.

Accordingly, the present invention discloses a method of controlling color point and/or color temperature of a wafer. Such a method comprises the steps of providing a wafer configured for emitting light; determining a desired color point of light emitted by said wafer; determining the pattern and/or thickness of the wavelength converting material to achieve said desired color point; and applying said wavelength converting material to the determined pattern and/or thickness onto a top surface of the wafer. Thickness and the pattern utilized will affect the color point of the emitted light.

Further, controlling the color point can be accomplished by determining the desired color point, thereby permitting the proper thickness of a wavelength converting material to be applied to the wafer surface to achieve the determined color point. In the current process, the wavelength converting material is deposited prior to dicing the wafer into individual mesas since the wavelength converting material is not deposited on the side walls. Conventional process will dice the wafer prior to depositing the converting material because converting material is needed on the emitting side walls of a conventional LED to achieve the desired color point.

The present invention also provides an improved method for determining if the LED is a defective LED or not. As previously mentioned, testing conventional LEDs is accomplished after the LED has been diced, coated with a wavelength converting material and packaged. In the present invention, the wavelength converting material can be deposited directly on top of the LED and test prior to dicing if desired. Alternatively, the LED can be tested after dicing but prior to packaging, thereby any defective LED can be discarded before packaging and without the waste of a usable package.

In another embodiment, the invention features a light-emitting device that includes a multi-layer stack of materials. The multi-layer stack of materials includes a light-generating region and a first layer supported by the light-generating region. The surface of the first layer is configured so that light generated by the light-generating region can emerge from the light-emitting device via the surface of the first layer. The surface of the first layer has a dielectric function that varies spatially according to a pattern, and the pattern can have an ideal lattice constant and a detuning parameter with a value greater than zero.

In still another embodiment, the invention features a light-emitting device that includes a multi-layer stack of materials. The multi-layer stack of materials includes a light-generating region and a first layer supported by the light-generating region. The surface of the first layer is configured so that light generated by the light-generating region can emerge from the light-emitting device via the surface of the first layer, and the surface has a dielectric function that varies spatially according to a nonperiodic pattern.

In a further embodiment, the invention features a light-emitting device that includes a multi-layer stack of materials. The multi-layer stack of materials includes a light-generating region and a first layer supported by the light-generating region. The surface of the first layer is configured so that light generated by the light-generating region can emerge from the light-emitting device via the surface of the first layer, and the surface has a dielectric function that varies spatially according to a complex periodic pattern.

In one embodiment, the invention features a light-emitting device that includes a multi-layer stack of materials. The multi-layer stack of materials includes a layer of n-doped material, a layer of p-doped material, and a light-generating region. The light-emitting device also includes a layer of reflective material that is capable of reflecting at least about 50% of light generated by the light-generating region that impinges on the layer of reflective material. The surface of the layer of n-doped material is configured so that light generated by the light-generating region can emerge from the light-emitting device via the surface of the layer of n-doped material. The surface of the layer of n-doped material has a dielectric function that varies spatially according to a pattern, and the distance between the layer of p-doped material and the layer of reflective material is less than the distance between the layer of n-doped material and the layer of reflective material.

In another embodiment, the invention features a light-emitting device that includes a multi-layer stack of materials including a light-generating region and a first layer supported by the light-generating region. The surface of the first layer is configured so that light generated by the light-generating region can emerge from the light-emitting device via the surface of the first layer, and the surface of the first layer has a dielectric function that varies spatially according to a pattern. The light-emitting device also includes a layer of reflective material that is capable of reflecting at least about 50% of light generated by the light-generating region that impinges on the layer of reflective material. The light-generating region is between the layer of reflective material and the first layer, and the pattern does not extend beyond the first layer.

In a further embodiment, the invention features a light-emitting device that includes a multi-layer stack of materials. The multi-layer stack of materials includes a light-generating region, and a first layer supported by the light-generating region. The surface of the first layer is configured so that light generated by the light-generating region can emerge from the light-emitting device via the surface of the first layer. The light-emitting device also includes a material in contact with the surface of the first layer, where the material has an index of refraction less than about 1.5. The light emitting device is packaged.

In another embodiment, the invention features a light-emitting device that includes a multi-layer stack of materials including a light-generating region and a first layer supported by the light-generating region. The surface of the first layer is configured so that light generated by the light-generating region can emerge from the light-emitting device via the surface of the first layer. The surface of the first layer has a dielectric function that varies spatially according to a pattern, and the pattern is configured so that light generated by the light-generating region that emerges from the light-emitting device via the surface of the first layer is more collimated than a lambertian distribution of light.

In a further embodiment, the invention features a wafer that includes a plurality of light-emitting devices. At least some of the light-emitting devices include a multi-layer stack of materials. The multi-layer stack of materials includes a light-generating region and a first layer supported by the light-generating region. The surface of the first layer is configured so that light generated by the light-generating region can emerge from the light-emitting device via the surface of the first layer. The surface of the first layer has a dielectric function that varies spatially according to a pattern, and the pattern is configured so that light generated by the light-generating region that emerges from the light-emitting device via the surface of the first layer is more collimated than a lambertian distribution of light. The wafer has at least about five (e.g., at least about 25, at least about 50) light-emitting devices per square centimeter.

In one embodiment, the invention features a light-emitting device that includes a multi-layer stack of materials. The multi-layer stack of materials includes a light-generating region and a first layer supported by the light-generating region so that, during use of the light-emitting device, light generated by the light-generating region can emerge from the light-emitting device via a surface of the first layer. The surface of the first layer has a dielectric function that varies spatially according to a pattern, and at least about 45% (e.g., at least about 50%, at least about 60%, at least about 70%) of the total amount of light generated by the light-generating region that emerges from the light-emitting device emerges via the surface of the light-emitting device.

In another embodiment, the invention features a light-emitting device that includes a multi-layer stack of materials. The multi-layer stack of materials includes a light-generating region and a first layer supported by the light-generating region so that, during use of the light-emitting device, light generated by the light-generating region can emerge from the light-emitting device via a surface of the first layer. The light-emitting device has an edge which is at least about one millimeter (e.g., at least about 1.5 millimeters, at least about two millimeters, at least about 2.5 millimeters) long, and the light-emitting device is designed so that the extraction efficiency of the light-emitting device is substantially independent of the length of the edge of the length of the edge.

In a further embodiment, the invention features a light-emitting device that includes a multi-layer stack of materials. The multi-layer stack of materials includes a light-generating region and a first layer supported by the light-generating region so that, during use of the light-emitting device, light generated by the light-generating region can emerge from the light-emitting device via a surface of the first layer. The light-emitting device has an edge which is at least about one millimeter (e.g., at least about 1.5 millimeters, at least about two millimeters, at least about 2.5 millimeters) long, and the light-emitting device is designed so that the quantum efficiency of the light-emitting device is substantially independent of the length of the edge of the length of the edge.

In one embodiment, the invention features a light-emitting device that includes a multi-layer stack of materials. The multi-layer stack of materials includes a light-generating region and a first layer supported by the light-generating region so that, during use of the light-emitting device, light generated by the light-generating region can emerge from the light-emitting device via a surface of the first layer. The light-emitting device has an edge which is at least about one millimeter (e.g., at least about 1.5 millimeters, at least about two millimeters, at least about 2.5 millimeters) long, and the light-emitting device is designed so that the wall plug efficiency of the light-emitting device is substantially independent of the length of the edge of the length of the edge.

In another embodiment, the invention features a method of making a light-emitting device. The method includes bonding a layer of a reflective material with a layer of p-doped material. The light-emitting device includes a multi-layer stack of materials including the layer of p-doped material, a light-generating region, and a first layer. The first layer includes a surface having a dielectric function that varies spatially according to a pattern, and the reflective material is capable of reflecting at least about 50% of light generated by the light-generating region that impinges on the layer of reflective material.

In a further embodiment, the invention features a method of making a light-emitting device. The method includes disbanding a substrate bonded with a first layer. The first layer forms a portion of a multi-layer stack of materials that includes a light-generating region, and the method forms a light-emitting device in which a surface of the first layer has a surface with a dielectric function that varies spatially according to a pattern.

Embodiments can feature one or more of the following aspects.

The multi-layer stack of materials can be formed of a multi-layer stack of semiconductor materials. The first layer can be a layer of n-doped semiconductor material, and the multi-layer stack can further include a layer of p-doped semiconductor material. The light-generating region can be between the layer of n-doped semiconductor material and the layer of p-doped semiconductor material.

The light-emitting device can further include a support that supports the multi-layer stack of materials.

The light-emitting device can further include a layer of reflective material that is capable of reflecting at least about 50% of light generated by the light-generating region that impinges on the layer of reflective material. The layer of reflective material can be between the support and the multi-layer stack of materials. The distance between the layer of p-doped semiconductor material and the layer of reflective material can be less than a distance between the layer of n-doped semiconductor material and the layer of reflective material. The light-emitting device can further include a p-ohmic contact layer between the layer of p-doped material and the layer of reflective material.

The light-emitting device can further include a current-spreading layer between the first layer and the light-generating region.

The multi-layer stack of materials can be formed of semiconductor materials, such as, for example, III-V semiconductor materials, organic semiconductor materials and/or silicon.

In some embodiments, the pattern does not extend into the light-generating region.

In certain embodiments, the pattern does not extend beyond the first layer.

In some embodiments, the pattern extends beyond the first layer.

The light-emitting device can further include electrical contacts configured to inject current into the light-emitting device. The electrical contacts can be configured to vertically inject electrical current into the light-emitting device.

The pattern can be partially formed of a component selected from, for example, holes in the surface of the first layer, pillars in the first layer, continuous veins in the first layer, discontinuous veins in the first layer and combinations thereof.

In some embodiments, the pattern can be selected from triangular patterns, square patterns, and grating patterns.

In certain embodiments, the pattern can be selected from aperiodic patterns, quasicrystalline patterns, Robinson patterns, and Amman patterns. In some embodiments, the pattern is a Penrose pattern.

In some embodiments, the pattern is selected from honeycomb patterns and Archimidean patterns. In certain embodiments, a pattern (e.g., a honeycomb pattern) can have holes with different diameters.

The pattern can be partially formed of holes in the surface of the first layer.

The detuning parameter can be, for example, at least about 1% of the ideal lattice constant and/or at most about 25% of the ideal lattice constant. In some embodiments, the pattern can correspond to a substantially randomly detuned ideal pattern.

The pattern can be configured so that light emitted by the surface of the first layer has a spectrum of radiation modes, and the spectrum of radiation modes is substantially the same as a characteristic emission spectrum of the light-generating region.

The light-emitting device can be, for example, a light-emitting diode, a laser, or an optical amplifier. Examples of light-emitting devices include organic light-emitting devices (OLEDs), flat surface-emitting LEDs, and high brightness light-emitting devices (HBLEDs).

In some embodiments, the surface of the first layer has features with a size of less than about $\lambda/5$, where $\lambda$ is a wavelength of light that can be emitted by the first layer.

In certain embodiments, the light-emitting device is packaged (e.g., in the form of a packaged die). In some embodiments, a packaged light-emitting device can be free of an encapsulant material.

In some embodiments, the material in contact with the surface of the first layer is a gas (e.g., air). The gas can have a pressure of less than about 100 Torr.

In certain embodiments, the material in contact with the surface of the first layer has an index of refraction of at least about one.

Methods of making a wafer can include disposing the phosphor material to form of a layer having a thickness that varies by less than about 20%, or by less than about 10%, or having substantially no variation. The methods can include flattening the layer of the phosphor material to achieve such thickness variations. The methods can also include flattening the phosphor material after disposing the phosphor material on the surface of the first layer. The phosphor material can be, for example, spin-coated on the surface of the wafer. The methods can include forming a plurality of the light emitting devices from the wafer, and separating at least some of the light-emitting devices from each other.

In some embodiments, when light generated by the light-generating region emerges from the light-emitting device via the surface of the first layer, at least about 40% of the light emerging via the surface of the first layer emerges within at most about 30° of an angle normal to the surface of the first layer.

Methods of making a light-emitting device can further include, before bonding the layer of the reflective material with the layer of p-doped material, bonding the first layer with a substrate, the multi-layer stack of materials being between the substrate and the layer of reflective material. The methods can also include forming a bonding layer between the first layer and the substrate. The methods can also include removing the substrate. The methods can further include lapping and polishing steps after removing the substrate. The substrate can be removed after bonding the layer of the reflective material with the first layer. Removing the substrate can include heating a bonding layer disposed between the first layer and the substrate. Heating the bonding layer can decompose at least a portion of the bonding layer. Heating the bonding layer can include exposing the bonding layer to radiation emitted by a laser. Removing the substrate can include exposing the substrate using a laser liftoff process. Removing the substrate can result in the surface of the first layer becoming substantially flat. The methods can further include, before forming the pattern in the surface of the first layer, planarizing the surface of the first layer after the first substrate is removed. Planarizing the surface of the first layer can include chemical-mechanical polishing the surface of the first layer. Planarizing the surface of the first layer can reduce the roughness of the surface of the first layer to greater than about $\lambda/5$, where $\lambda$ is a wavelength of light that can be emitted by the first layer. Forming the pattern can include using nanolithography. The methods can also include disposing a substrate on the layer of reflective material. The methods can further include disposing a current-spreading layer between the first layer and the light-generating region.

Embodiments can feature one or more of the following advantages.

In certain embodiments, an LED and/or a relatively large LED chip can exhibit relatively high light extraction.

In some embodiments, an LED and/or a relatively large LED chip can exhibit relatively high surface brightness, relatively high average surface brightness, relatively low need for heat dissipation or relatively high rate of heat dissipation, relatively low etendue and/or relatively high power efficiency.

In certain embodiments, an LED and/or a relatively large LED chip can be designed so that relatively little light emitted by the LED/LED chip is absorbed by packaging.

In some embodiments, a packaged LED (e.g., a relatively large packaged LED) can be prepared without using an encapsulant material. This can result in a packaged LED that avoids certain problems associated with the use of certain encapsulant materials, such as reduced performance and/or inconsistent performance as a function of time, thereby providing a packaged LED that can exhibit relatively good and/or reliable performance over a relatively long period of time.

In some embodiments, an LED (e.g., a packaged LED, which can be a relatively large packaged LED) can be designed to provide a desired light output within a particular angular range (e.g., within a particular angular range relative to the LED surface normal).

In some embodiments, an LED and/or a relatively large LED chip can be prepared by a process that is relatively inexpensive.

In certain embodiments, an LED and/or a relatively large LED chip can be prepared by a process that can be conducted on a commercial scale without incurring costs that render the process economically unfeasible.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A light emitting device comprising:
a multi-layer stack of material including a n-doped region, an p-doped region and a light generating region disposed between the n-doped and p-doped regions, wherein a portion of the light generated from the light generating region emerges from the light emitting device via a top emission surface of the multi-layer stack of materials;
a first wavelength converting material region disposed on at least a portion of the top emission surface and a second wavelength converting material region disposed on at least a portion of the emission surface, wherein the first wavelength converting material is configured to emit light at a different frequency than the second wavelength converting material.

2. The light emitting device of claim 1, wherein the wavelength converting material is phosphor.

3. The light emitting device of claim 1, wherein the light emitting device is configured to emit white, green, blue, red, amber, cyan, yellow, UV and IR light.

4. The light emitting device of claim 1, wherein greater than 50% of the emitted light emerges from the light emitting device via the top emission surface.

5. The light emitting device of claim 1, wherein greater than 75% of the emitted light emerges from the light emitting device via the top emission surface.

6. The light emitting device of claim 1, wherein greater than 90% of the emitted light emerges from the light emitting device via the top emission surface.

7. The light emitting device of claim 1, wherein greater than 50% of light emitted at a first wavelength is converted to a desired second wavelength by the first or second wavelength converting material.

8. The light emitting device of claim 1, wherein greater than 75% of light emitted at a first wavelength is converted to a desired second wavelength by the first or second wavelength converting material.

9. The light emitting device of claim 1, wherein greater than 90% of light emitted at a first wavelength is converted to a desired second wavelength by the first or second wavelength converting material.

10. The light emitting device of claim 1, wherein the first wavelength converting material region is separated from the second wavelength converting material region by a distance.

11. The light emitting device of claim 1, wherein the first wavelength converting material region and the second wavelength converting material region are arranged in a striped pattern.

12. The light emitting device of claim 1, wherein the wavelength converting material does not cover the entire emission surface.

13. The light emitting device of claim 1, wherein the light emitted from the first wavelength converting material region mixes with light emitted from the second wavelength converting material region.

14. The light emitting device of claim 1, wherein a thickness of the first wavelength converting material region and the second wavelength converting material region is between 100 nm and 100 microns.

15. The light emitting device of claim 1, wherein a length or width of the first wavelength converting material region and the second wavelength converting material region is between 1 micron and 100 microns.

16. The light emitting device of claim 1, wherein sidewalls of the multi-layer stack of material are substantially devoid of the wavelength converting material.

17. The light emitting device of claim 1, wherein the first and second wavelength converting materials are disposed according to a predetermined pattern.

18. The light emitting device of claim 17, wherein the predetermined pattern is configured to produce a desired color point.

19. The light emitting device of claim 1, further comprising a plurality of recesses formed in the top emission surface.

20. The light emitting device of claim 19, wherein the recesses are formed according to a pattern.

21. The light emitting device of claim 19, wherein the wavelength converting material is disposed only in the recesses in the top emission surface.

22. The light emitting device of claim 19, wherein the top emission surface is a top surface of an n-type layer.

23. The light emitting device of claim 19, wherein the recesses are holes.

24. The light emitting device of claim 23, wherein the holes have a cross-sectional dimension of less than 1 micron.

25. The light emitting device of claim 1, wherein at least one of the first and second wavelength converting materials are disposed according to a pattern.

26. The light emitting device of claim 25, wherein the pattern comprises a plurality of discrete features.

27. The light emitting device of claim 25, wherein the pattern comprises a plurality of stripes.

28. The light emitting device of claim 25, wherein the pattern is pre-determined.

29. The light emitting device of claim 25, wherein the pattern is configured to produce a desired color point.

30. The light emitting device of claim 29, wherein the pattern is configured to produce a desired color point by adjusting a ratio of size of the first wavelength converting material region in relation to distance between the first wavelength material region and the second wavelength converting material region.

31. The light emitting device of claim 25, wherein the first wavelength converting material and the second wavelength converting material are disposed according to a pattern.

32. The light emitting device of claim 31, wherein the pattern covers greater than 50% of the emission surface area.

33. The light emitting device of claim 31, wherein the pattern covers between 25% and 75% of the emission surface area.

* * * * *